(12) United States Patent
Ricotti

(10) Patent No.: US 7,274,256 B2
(45) Date of Patent: Sep. 25, 2007

(54) INPUT AMPLIFIER STAGE IN THE AB CLASS HAVING A CONTROLLED BIAS CURRENT

(75) Inventor: Giulio Ricotti, Broni (PV) (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 24 days.

(21) Appl. No.: 11/069,838

(22) Filed: Feb. 28, 2005

(65) Prior Publication Data

US 2005/0206451 A1   Sep. 22, 2005

(30) Foreign Application Priority Data

Feb. 27, 2004   (IT) .............................. MI04A0355

(51) Int. Cl.
*H03F 3/45*   (2006.01)
(52) U.S. Cl. ..................... 330/255; 330/257; 330/260
(58) Field of Classification Search ................. 330/255
See application file for complete search history.

(56) References Cited

U.S. PATENT DOCUMENTS 5,909,136 A * 6/1999 Kimura ....................... 327/356
6,008,667 A * 12/1999 Fahrenbruch ................. 326/66
6,100,762 A * 8/2000 Kato ........................... 330/255
6,771,126 B2 * 8/2004 Blankenship et al. ........ 330/257
6,804,477 B2   10/2004 Maruyama \* cited by examiner

*Primary Examiner*—Benny Lee
*Assistant Examiner*—Alan Wong
(74) *Attorney, Agent, or Firm*—Lisa K. Jorgenson; Bryan A. Santarelli; Graybeal Jackson Haley LLP

(57) ABSTRACT

The invention relates to an input amplifier stage, in AB class, having a controlled bias current and comprising a differential cell, inserted between a first supply voltage reference and a second voltage reference, having a differential pair of input transistors receiving respective differential signals and a pair of bias transistors, as well as an output-buffer circuit portion coupled to the cell by means of at least a supplementary parallel branch of transistors. This stage also comprises an additional circuit block, able to output the absolute value of an input current, inserted between a node of the differential cell of the input stage and a node of the supplementary branch in order to add the absolute value of a portion of the signal current to the differential cell bias current.

25 Claims, 5 Drawing Sheets

INPUT AMPLIFIER STAGE IN THE AB CLASS HAVING A CONTROLLED BIAS CURRENT

PRIORITY CLAIM

This application claims priority from Italian patent application No. MI2004A 000355, filed Feb. 27, 2004, which is incorporated herein by reference.

TECHNICAL FIELD

The present invention relates generally to an input amplifier stage in the AB class having a controlled bias current, particularly for analogue applications with audio signals.

More particularly, the invention relates to such an amplifier stage comprising a differential cell, inserted between a first supply voltage reference and a second voltage reference, having a differential pair of input transistors receiving respective differential signals and a pair of bias transistors, as well as an output-buffer circuit portion coupled to the cell by means of at least a supplementary parallel branch of transistors.

BACKGROUND

As it is well known in this specific technical field, in many audio applications, which require analog audio signals to be amplified, operational amplifiers inserted as an input stage of an amplifier in the AB class are widely used.

For a more detailed description of this kind of amplifier, reference is made, for example, to the U.S. Pat. No. 6,804,477.

In view of increasingly reducing the electric power consumption of any electronic device, particularly for applications on portable devices, operational amplifiers should be biased with lower and lower current levels.

In this context it must be considered that, by operating in the A class, the signal amplitude should always be lower than the bias current/voltage levels.

However, this need involves a limitation of the overall amplifier performance.

Very briefly, the biasing in the AB class allows the bias current/voltage levels of the different stages composing the amplifier to be dynamically changed, and according to the amplitude of the applied signal, considerably improving the overall efficiency and performances.

More particularly, input amplifier stages in the AB class allow the slew-rate parameters of the whole amplifier to be increased.

The here-attached FIG. 1 shows a traditional example, taken from the known prior art, of an input amplifier stage of the AB class.

In this example, it can be noted how a differential cell 1 receiving differential input signals If+, If−, could be coupled to other amplifier circuit portions by means of a series of current mirrors being conveniently located along the input-output signal path.

Therefore, a positive bias current can always be added to the differential stage and proportionally to the absolute value of the applied signal.

On the contrary, this bias current falls to the lowest values when no signal is applied.

Although advantageous in many aspects, this known technical solution does not allow the highest bias current to be precisely determined for applications in AB class.

Moreover, the known structure is quite complex and it requires a plurality of current mirrors to obtain an additional current always having a positive value.

SUMMARY

An embodiment of the present invention is an input amplifier stage structure, in AB class, having such structural and functional features as to allow the bias current to be adjusted, particularly for applications requiring the highest bias current to be controlled.

This embodiment of the present invention includes a circuit block being able to output the absolute value of an input current and to couple such a block between a node of the input stage differential cell and a supplementary output branch in order to add said absolute value to the differential cell bias current.

Accordingly, an amplifier according to an embodiment of the invention includes an input stage as previously indicated and an additional circuit block, being able to output the absolute value of an input current, inserted between a node of the input stage differential cell and said supplementary branch in order to add the absolute value of a portion of a signal current to the differential cell bias current.

BRIEF DESCRIPTION OF THE DRAWINGS

Features and advantages of the input amplifier stage according to the invention will be apparent from the following description of an embodiment thereof given by way of non-limiting example with reference to the attached drawings.

DETAILED DESCRIPTION

Figure 1:
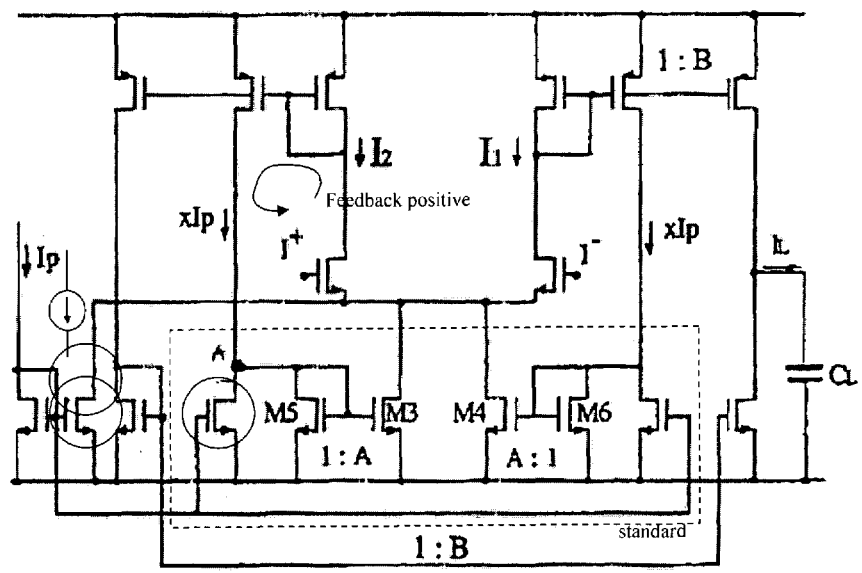
FIG. 1 is a schematic diagram of an input amplifier stage in AB class realised according to the prior art.
Figure 2:
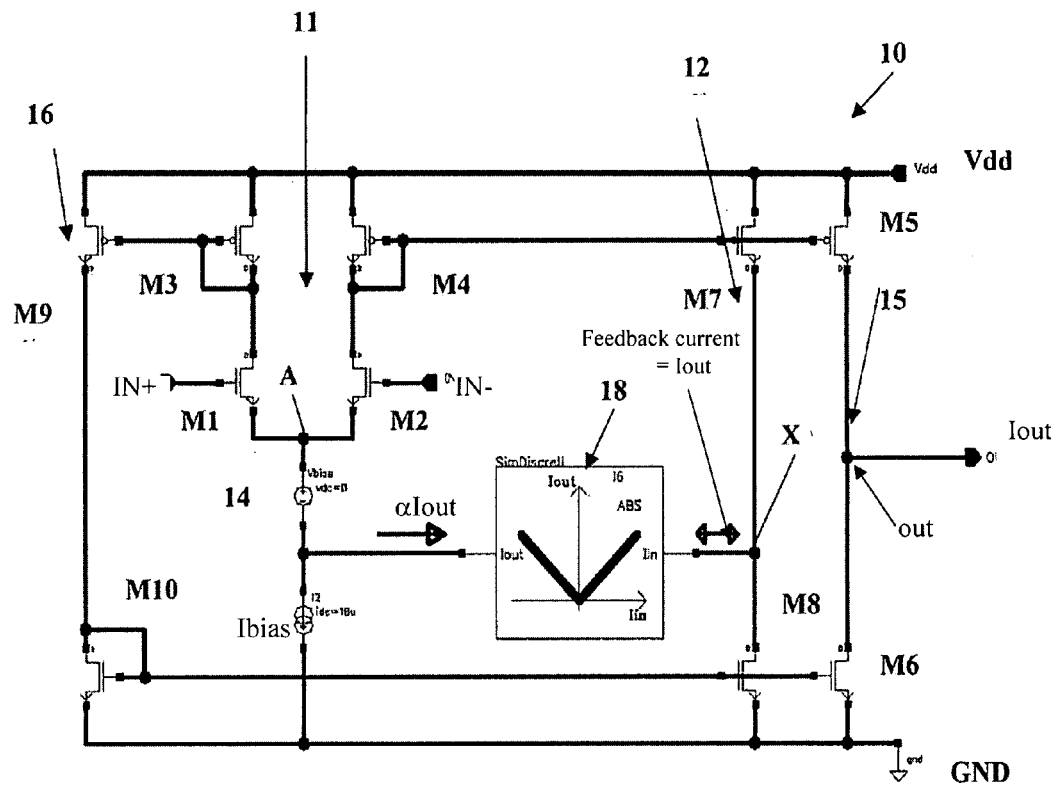
FIG. 2 is a schematic diagram of an input amplifier stage in AB class realised according to an embodiment of the present invention.

With reference to the figures, and particularly to the example of FIG. 2, an input amplifier stage in AB class, according to an embodiment of the present invention, having a controlled bias current Ibias and for analog applications with audio signals, is globally and schematically indicated a 10.

In the embodiment being now considered by way of non limiting example, the amplifier basic structure 10 is the structure of a Miller operational amplifier whereto a convenient circuit block has been added.

The stage 10 is preferably realised as a semiconductor integrated circuit in the CMOS technology.

The stage 10 comprises a differential cell 11 with a differential pair of input transistors M1, M2, and a pair of bias transistors M3, M4. The differential pair of input transistors M1, M2 receives on respective inputs IN+, IN−, a pair of differential signals.

The cell 11 is preferably realised by MOS transistors, even though nothing would prevent it from being realised in the mixed BiCMOS technology with the input differential pair comprising bipolar transistors and the output pair comprising MOS transistors, or vice versa.

The cell 11 is inserted between a first supply voltage reference Vdd and a second voltage reference, for example a signal ground GND.

A current generator 14 is inserted between a connection node A of the differential pair of input transistors M1, M2 and the ground GND.

The input amplifier stage 10 also comprises an output-buffer circuit portion 15 including a complementary pair of transistors, M5, M6, inserted between the supply Vdd and the ground GND. The interconnection node OUT between these transistors M5, M6 of the output buffer 15 is the output node of the stage 10.

A supplementary branch 12 of transistors M7, M8, forming in turn a complementary pair, is also provided, being connected in parallel to the output buffer 15.

The control terminals of the transistors M5 and M7 are connected to each other and to the control terminal of the transistor M4.

A further supplementary branch 16 of transistors M9, M10, forming in turn a complementary pair, is connected in parallel to the cell 11, the control terminal of the transistor M9 being connected to the control terminal of the transistor M3 and the control terminal of the transistor M10 being connected to the control terminals of the transistors M6, M8.

Advantageously, according to an embodiment of the invention, a circuit block 18 is provided, being able to output the absolute value of an input current.

This block 18 has an output connected to the node A of the differential cell 11 and an input connected to an interconnection node X between the transistors M7, M8 of the supplementary branch 12.

Figure 5:
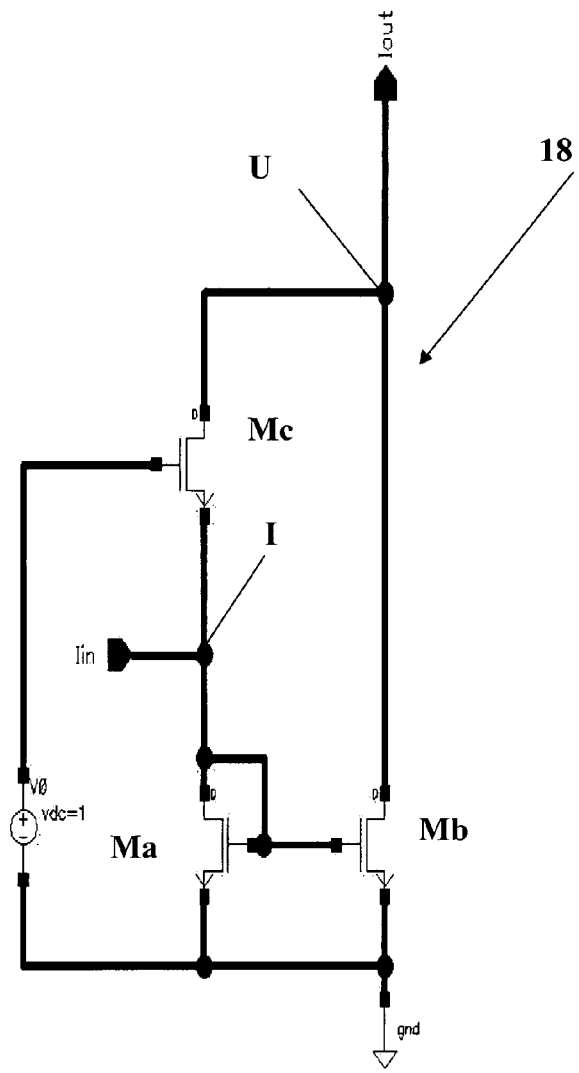
FIG. 5 is a schematic diagram of a particular circuit embodiment of the input stage of FIG. 2.

FIG. 5 shows a possible example of the circuit block 18 extracting the absolute current value.

The block 18 is realised by MOS transistors and it provides an input I, connected to the node X of the branch 12 and receiving a current Iin, and an output U connected to the node A of the cell 11 and providing a current αIout.

A pair of NMOS transistors Ma, Mb, connected to each other in a current mirror configuration, is inserted between the input I and the ground.

A third transistor Mc, of the PMOS type, has the conduction terminals inserted between the input I and the output U and the control terminal being kept at a predetermined voltage value Vo.

The drain terminal of the transistor Mb is also connected to the output U.

In summary, the circuit block 18 is able to perform the non linear function of an "absolute value" of a current. This function has been schematised in FIG. 2 as a relevant current-to-current diagram.

The block 18 is substantially an operator block being conveniently connected to the differential cell node A in order to draw a portion αIout of the signal current produced by the cell 11 itself against the differential signal received at the input.

In the amplifier stage 10 according to an embodiment of the invention, the biasing in AB class has been applied to a Miller-topology operational basic structure, whereto the circuit block 18 has been added, "sensing" the current in the branch 12 (which is the same as the current in the branch 15, and thus is equal to Iout) and forcing a portion of Iout to cross the block 18 and thus to be added at the node A to the differential pair bias current. This added portion is αIout.

Figure 3:
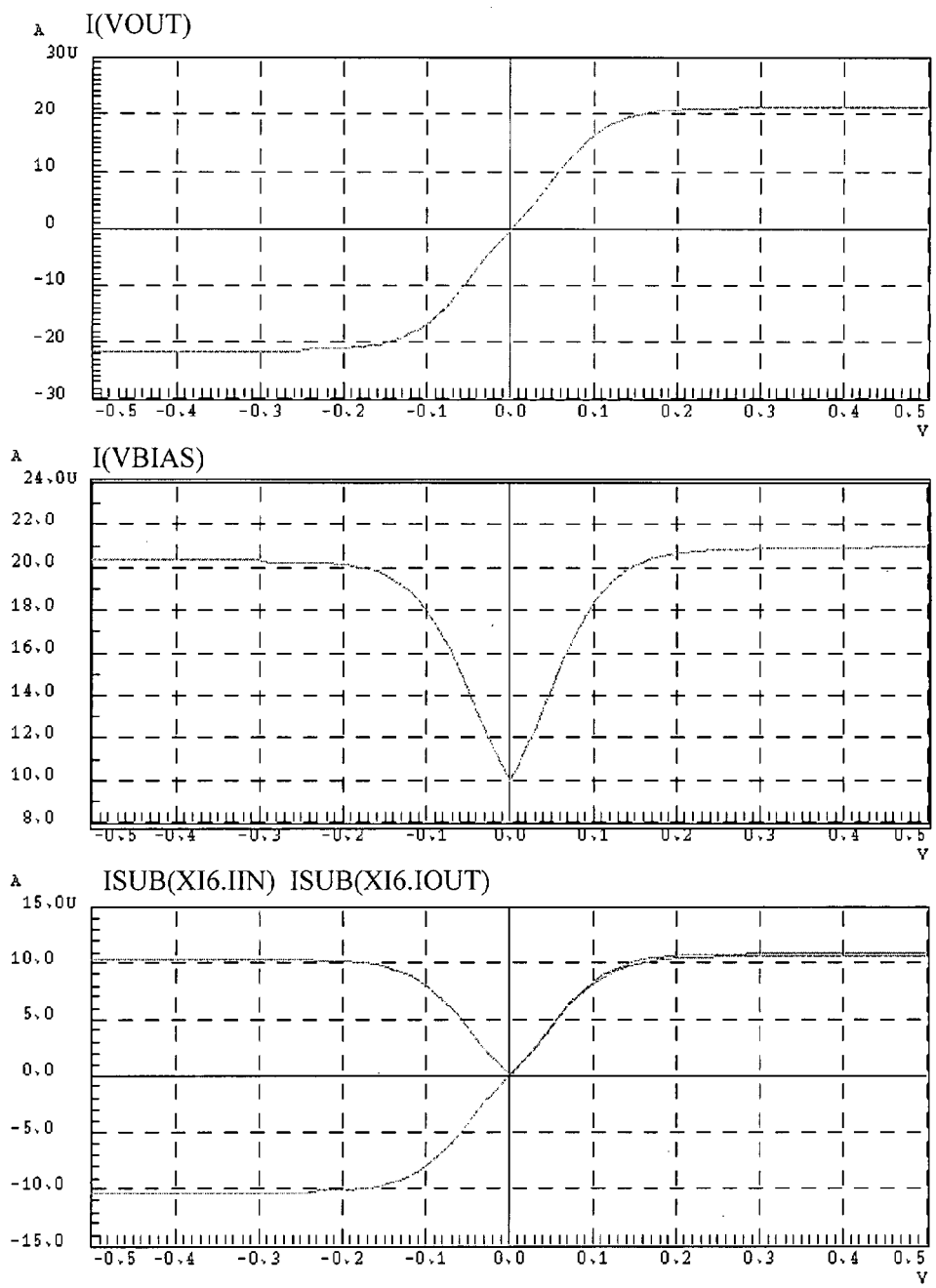
FIG. 3 shows a series of current/voltage diagrams obtained by simulation and sharing the same x-axis, indicating voltage values (mV), and having on the y-axis the values of the output current Iout, of the bias current Ibias, and of the additional current Isub, respectively.

FIG. 3 shows the signal current resulting at the output node OUT with α=0.5 (once being closed onto a low impedance). It can be noted that it results Iout=2Ibias, i.e., the output current doubles the bias current.

A peculiarity of this solution is certainly given by the circuit simplicity.

Moreover, the highest current can be mathematically determined, and it depends from a geometrical ratio between the sizes of the MOS transistors being incorporated in the circuit block 18 and the MOS transistors of the signal path.

Since these size ratios are a well-controllable and repetitive geometrical parameter, it results that the highest current value can be actually determined a priori.

By considering that the parameter a is determined by the mirror ratio between the transistors Ma and M4 and between Mb and M3 respectively, and assuming for this embodiment that the sizes of M3-M10 are the same, what is obtained is:

$$Iout=Ibias+\alpha*Iout$$

$$Iout=Ibias/(1-\alpha)$$

Therefore, if for example α=0.5, it results that the highest regenerated current doubles the bias current, having $$Iout=Ibias/(1-0.5)=2*Ibias.$$

This situation is shown in the diagrams of FIG. 3.

By defining a geometrical ratio corresponding to α=0.9, it results:

$$Iout=Ibias/(1-0.9)=10*Ibias.$$

By drawing a geometrical ratio corresponding to α=0.8, it results:

$$Iout=Ibias/(1-0.8)=5*Ibias.$$

Figure 4:
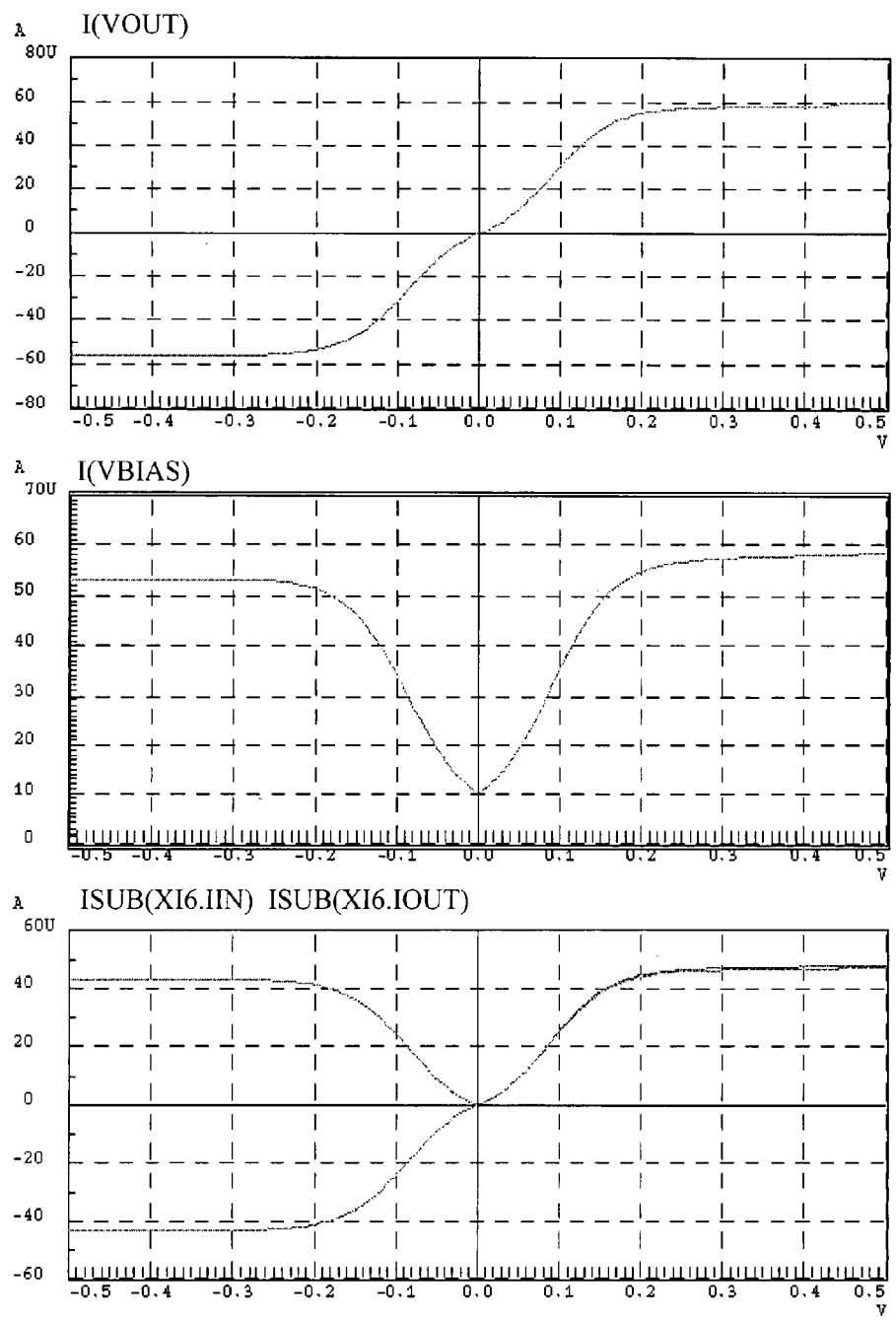
FIG. 4 shows a series of current/voltage diagrams corresponding to the ones of FIG. 3, but with a size selection generating a different additional current value Isub.

The latter situation is shown in the diagrams of FIG. 4.

Also considering the case of α corresponding to 1, in this case the geometrical control of the highest current would be lost and the limitation would only occur by saturation of the transistor current carrying capacity.

Referring to FIG. 2, an amplifier can incorporate the input stage 10, and an electronic circuit such as an integrated circuit can incorporate such an amplifier, and an electronic system can incorporate such an integrated circuit.

From the previous description it clearly derives that the input differential stage according to an embodiment of the invention solves the technical problem and it obtains several advantages, including the opportunity to precisely adjust the effective bias current value, particularly for applications requiring a control on the highest effective bias current. Also, although described as having the same size, the transistors M3-M10 may have different sizes and operate in a manner similar to that described above to obtain a dynamic bias current.

From the foregoing it will be appreciated that, although specific embodiments of the invention have been described herein for purposes of illustration, various modifications may be made without deviating from the spirit and scope of the invention.

What is claimed is:

1. An input amplifier stage, in AB class, having a controlled bias current and comprising a differential cell, inserted between a first supply voltage reference and a second voltage reference, having a differential pair of input transistors receiving respective differential signals and a pair of bias transistors, as well as an output-buffer circuit portion coupled to the cell by means of at least a supplementary parallel branch of transistors, wherein the input amplifier stage comprises an additional circuit block, able to output the absolute value of an input current, inserted between a node of the differential cell of the input stage and said supplementary branch in order to add the absolute value of a portion of the signal current to the differential cell bias current.

2. An input stage according to claim 1 wherein said node of the differential cell is an interconnection node of the transistors of the input differential pair.

3. An input stage according to claim 1 wherein said supplementary branch comprises a complementary pair of transistors and the input of said supplementary circuit block is connected to an interconnection node therebetween.

4. An input stage according to claim 1 wherein the portion of said signal current is determined according to the size ratios between the transistors incorporated in said supplementary circuit block and the transistors of the bias pair.

5. An input stage according to claim 4 wherein the portion of said signal current is preferably comprised between 0.5 and 1.

6. An input stage according to claim 4 wherein the portion of said signal current is lower than 1.

7. An input stage according to claim 1 wherein said circuit block comprises at least a current mirror.

8. An input stage according to claim 1 wherein the stage basic structure is of Miller topology.

9. An input stage according to claim 1 wherein the stage is realized in the integrated CMOS technology.

10. An amplifier, comprising:
    an input section operable to generate an intermediate signal from a differential input signal;
    a first current generator operable to generate a first bias current for the input section; and
    a second current generator operable to generate from the intermediate signal a second bias current for the input section, the second bias current substantially proportional to an absolute value of an output current.

11. The amplifier of claim 10 wherein:
    the differential input signal comprises first and second complementary components;
    the intermediate signal comprises a differential intermediate signal having first and second complementary components; and
    the input section comprises,
        a first input transistor operable to receive the first component of the differential input signal;
        a second input transistor operable to receive the second component of the differential input signal;
        a first load transistor coupled to the first input transistor and operable to generate the first component of the differential intermediate signal; and
        a second load transistor coupled to the second input transistor and operable to generate the second component of the differential intermediate signal.

12. The amplifier of claim 10 wherein the first current generator is operable to generate the first bias current equal to a substantially constant current.

13. The amplifier of claim 10 wherein the second current generator comprises:
    a first section operable to generate a feedback current from the intermediate signal; and
    a second section operable to generate the second bias current from the feedback current.

14. The amplifier of claim 10 wherein the second current generator comprises:
    a first section operable to generate a feedback current from the intermediate signal; and
    a second section operable to generate the second bias current substantially proportional to an absolute value of the feedback current.

15. The amplifier of claim 10 wherein the second current generator comprises:
    a first section operable to generate a feedback current from the intermediate signal; and
    a second section operable to generate the second bias current substantially equal to a product of a less-than-unity scale factor and an absolute value of the feedback current.

16. The amplifier of claim 15 wherein the first section of the second current generator is operable to generate the feedback current substantially proportional to the output current.

17. The amplifier of claim 10 wherein:
    the intermediate signal comprises a differential intermediate signal having first and second complementary components; and
    an output section comprises,
        an output node operable to carry the output current,
        a first transistor coupled to the output node and operable to receive the first component of the intermediate signal, and
        a second transistor coupled to the output node and operable to receive the second component of the intermediate signal.

18. The amplifier of claim 10, further comprising an output section coupled to the input section and operable to generate the output current from the intermediate signal.

19. An amplifier, comprising:
    an input section operable to generate an intermediate signal from a differential input signal;
    a first current generator operable to generate a first bias current for the input section; and
    a second current generator operable to generate from the intermediate signal a second bias current for the input section,
    wherein the intermediate signal comprises a differential signal having first and second complementary components, and
    wherein the second current generator comprises,
        a first section having a feedback node, a first transistor coupled to the feedback node and operable to receive the first component of the intermediate signal, and a second transistor coupled to the feedback node and operable to receive the second component of the intermediate signal, and
        a second section including a current mirror having an input node coupled to the feedback node of the first section and having an output node, and including a transistor having a first node coupled to the input node of the current mirror and having a second node coupled to the output node of the current mirror, the current mirror and transistor operable to generate the second bias current at the output node of the current mirror.

20. An integrated circuit, comprising:
    an amplifier having,
        an input section operable to generate an intermediate signal from a differential input signal, a first current generator operable to generate a first bias current for the input section, and a second current generator operable to generate from the intermediate signal a second bias current for the input section, the second bias current substantially proportional to an absolute value of an output current.

21. An electronic system, comprising:

an integrated circuit including, an amplifier having, an input section operable to generate an intermediate signal from a differential input signal, a first current generator operable to generate a first bias current for the input section, and a second current generator operable to generate from the intermediate signal a second bias current for the input section, the second bias current substantially proportional to an absolute value of an output current.

22. A method, comprising:

biasing a differential input section of an amplifier with a first bias current;

generating an intermediate signal from a differential input signal with the input section;

generating a second bias current from the intermediate signal, the second bias current substantially proportional to an absolute value of an output current; and biasing the input section with the second bias current.

23. The method of claim 22 wherein generating the second bias current comprises:

converting the intermediate signal into a feedback current; and generating the second bias current from the feedback current.

24. The method of claim 22 wherein generating the second bias current comprises:

converting the intermediate signal into a feedback current having a magnitude and a polarity; and generating the second bias current having a fixed polarity and a magnitude that is substantially proportional to the magnitude of the feedback current.

25. The method of claim 22 wherein generating the second bias current comprises:

converting the intermediate signal into a feedback current having a magnitude and a polarity; and generating the second bias current having a fixed polarity and a magnitude that is less than and substantially proportional to the magnitude of the feedback current.

* * * * *